(12) United States Patent
Park et al.

(10) Patent No.: US 8,143,784 B2
(45) Date of Patent: Mar. 27, 2012

(54) DISPLAY DEVICE

(75) Inventors: Sang Tae Park, Suwon-si (KR); Myung Seop Kim, Seoul (KR); Jeong Dae Seo, Incheon (KR); Won Jae Yang, Gimpo-si (KR); Hyun Ju Choi, Seoul (KR); Young Hoon Shin, Seoul (KR); Chang Ho Hyeon, Yongin-si (KR); Jong Moo Lee, Anyang-si (KR)

(73) Assignee: LG Electronics Inc., Seoul (KR)

( * ) Notice: Subject to any disclaimer, the term of this patent is extended or adjusted under 35 U.S.C. 154(b) by 253 days.

(21) Appl. No.: 12/046,802

(22) Filed: Mar. 12, 2008
(Under 37 CFR 1.47)

(65) Prior Publication Data
US 2009/0134765 A1    May 28, 2009

(30) Foreign Application Priority Data

Mar. 23, 2007   (KR) .................. 10-2007-0028502

(51) Int. Cl.
*H01J 1/62* (2006.01)
*H01J 63/04* (2006.01)

(52) U.S. Cl. .................... 313/512; 313/504; 313/358

(58) Field of Classification Search .............. 313/238, 313/243, 504, 512, 582, 358, 495; 257/72
See application file for complete search history.

(56) References Cited

U.S. PATENT DOCUMENTS

| | | | | |
|---|---|---|---|---|
| 3,938,177 A | * | 2/1976 | Hansen et al. | 257/98 |
| 6,639,360 B2 | * | 10/2003 | Roberts et al. | 313/512 |
| 7,157,153 B2 | * | 1/2007 | Yamada et al. | 428/688 |
| 7,208,873 B2 | * | 4/2007 | Jeong | 313/512 |
| 7,973,474 B2 | * | 7/2011 | Kim et al. | 313/512 |
| 8,017,950 B2 | * | 9/2011 | Joo | 257/72 |
| 2003/0197475 A1 | * | 10/2003 | Takamura et al. | 315/169.4 |
| 2006/0066236 A1 | * | 3/2006 | Tanaka et al. | 313/512 |
| 2006/0145605 A1 | * | 7/2006 | Park | 313/506 |
| 2006/0145607 A1 | * | 7/2006 | Kim | 313/512 |
| 2007/0228382 A1 | * | 10/2007 | Yamazaki et al. | 257/72 |
| 2008/0007167 A1 | * | 1/2008 | Ahn et al. | 313/505 |

FOREIGN PATENT DOCUMENTS

JP       08201800 A   *   8/1996

* cited by examiner

*Primary Examiner* — Nimeshkumar Patel
*Assistant Examiner* — Glenn Zimmerman
(74) *Attorney, Agent, or Firm* — Ked & Associates LLP

(57) ABSTRACT

A display device includes a transparent plate having a first area and a second area, a first conductive line on the second area of the transparent plate, a substrate having a third area and a fourth area on the first area of the transparent plate, a display element on the third area of the substrate, and a second conductive line on the fourth area of the substrate. The second conductive line is electrically coupled between the display element and the first conductive line, and the first and second conductive lines are on different planes.

17 Claims, 8 Drawing Sheets

DISPLAY DEVICE

This application claims the benefit of Korean Patent Application No. 10-2007-0028502, filed on Mar. 23, 2007, which is hereby incorporated by reference as if fully set forth herein.

BACKGROUND OF THE INVENTION

1. Field of the Invention

The present invention relates to a display device, and more particularly to an interconnection of a display device including an OLED.

2. Discussion of the Related Art

In a multimedia age, it is required for a display device to be finer and larger and to express colors close to natural colors. There are limits to a CRT (Cathode Ray Tube) which is a conventional general display device. An LCD (Liquid Crystal Display), a PDP (Plasma Display Panel), an OLED (Organic Light Emitting Diode), a projection TV (Television) and the like are developing at a high speed to be widely used in a field of high-definition images.

Among the above-mentioned display devices, the OLED is a self light emitting display device, which has advantages such as a large viewing angle, excellent contrast and fast response time. Generally, an organic EL device has a structure in which an anode is formed on a substrate, and a hole injecting layer, a hole transporting layer, a light emitting layer, an electron transporting layer and a cathode are sequentially formed on the anode. Further, when a voltage is applied between the anode and the cathode, holes injected from the anode move to the light emitting layer through the hole transporting layer. Meanwhile, electrons are injected into the light emitting layer from the cathode through the electron transporting layer. In a region of the light emitting layer, carriers are recombined to produce excitons. The excitons move from an excited state to a ground state. Accordingly, fluorescent molecules of the light emitting layer emit light to form an image.

However, the above-mentioned conventional display devices such as an OLED have the following problems.

It is impossible to stably manufacture a display device such as an OLED on general glass and plastic in the recent technology. For example, since the OLED has an advantage capable of being bent or crooked, it is manufactured using a high priced special substrate. Accordingly, when the substrate including the OLED is used as a display device in an electronic product and the like, there are the following problems.

FIG. 1 illustrates a plan view showing an interconnection structure of a substrate including an OLED in the prior art. An OLED device 100 is formed on a substrate 110 in FIG. 1. In this case, although the OLED device including four pixels is schematically depicted in FIG. 1, the OLED device is generally formed of more pixels to transfer image information or text information. In this case, the OLED device is used as a display device of an application product 130 such as an air conditioner. Thus, the substrate 110 with the OLED device 100 is attached to one surface of the application product 130. Further, a transparent conductive material 120 is formed on the substrate 110 to connect the respective pixels to electrode lines 140 of the application product 130. That is, the transparent conductive material 120 serves to transfer current, light emitting signals and the like to the respective pixels of the OLED device 100.

In this case, the transparent conductive material 120 formed on the substrate 110 is formed of ITO (Indium-Tin-Oxide). Further, as shown in FIG. 1, since the area of the transparent conductive material 120 is larger than the area of the OLED device 100 in the substrate 110, there is a problem of spending the manufacturing cost for a high priced substrate. That is, only a portion, for example, a central portion of the high priced substrate is used to manufacture a light emitting device and the other portion thereof is wasted. That is, since it is impossible to stably manufacture a display device on general glass and plastic in the recent technology, when it is impossible to form a display device on a substrate having the same area as a small area of an application product, the cost is wasted.

SUMMARY OF THE INVENTION

Accordingly, the present invention is directed to a display device that substantially obviates one or more problems due to limitations and disadvantages of the related art.

An object of the present invention is to provide a display device and a temperature control unit having the display device which is capable of minimizing the manufacturing cost of a panel and the like by minimizing the waste of the substrate when a light emitting device such as an OLED is formed on a substrate.

Another object of the present invention is to provide a display device and a temperature control unit having the display device which is capable of manufacturing substrates having various shapes and sizes using general glass and plastic, thereby enabling various design applications.

Yet another object of the present invention is to provide a display device and a temperature control unit having the display device which is capable of improving a display effect by using a color substrate as a sealing layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device includes a substrate with a display element; and a transparent plate which is in contact with the substrate and has a larger area than that of the substrate.

In accordance with another aspect of the present invention, there is provided a display device comprising a substrate with a display element; an encapsulating plate formed on the substrate; and a transparent plate with the encapsulating plate inserted therein. In this case, contact points of lines of the display device and a transparent conductive material may be formed at a periphery of the encapsulating plate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
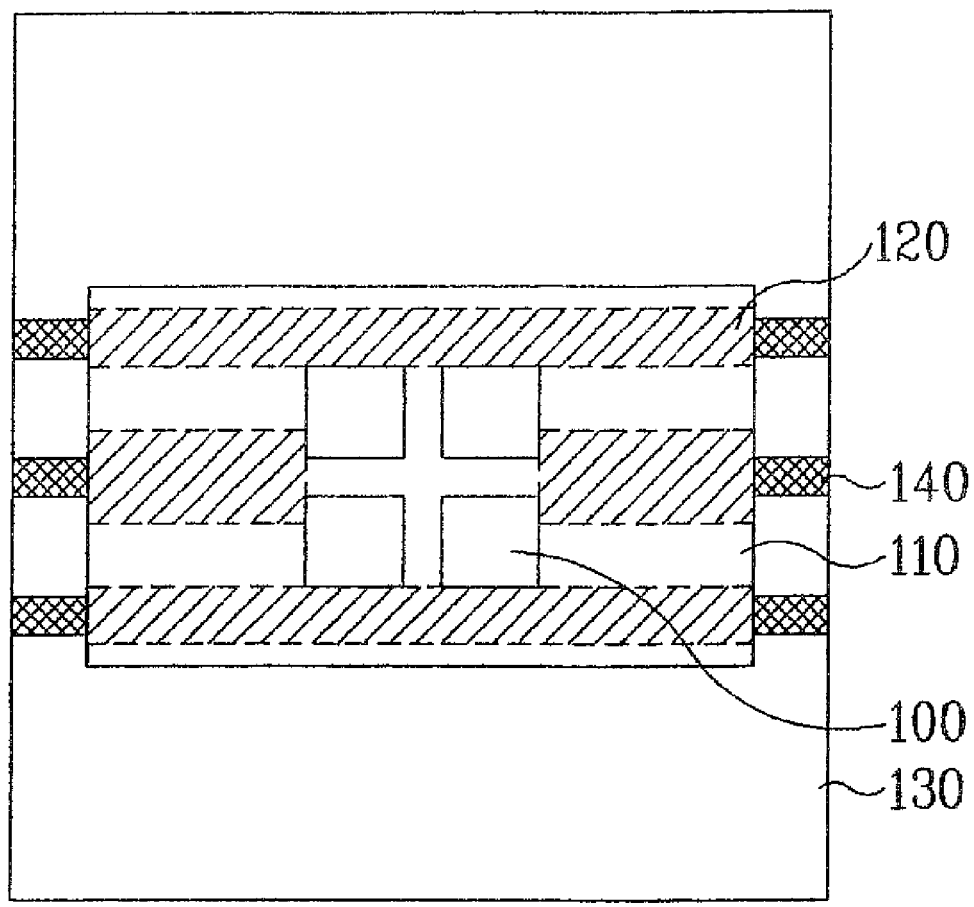
FIG. 1 illustrates a plan view showing an interconnection structure of a substrate including an OLED in the prior art.

Reference will now be made in detail to the preferred embodiments of the present invention, examples of which are illustrated in the accompanying drawings.

Hereinafter, embodiments of the present invention will be described in detail with reference to the accompanying drawings.

A dimension of a thickness is enlarged in the accompanying drawings to clearly represent several layers and regions. A thickness ratio of respective layers shown in the drawings is not equal to an actual thickness ratio. Meanwhile, when a portion such as a layer, a film, a region and a plate is formed or disposed "on" the other portion, it should be understood that the portion may be formed directly on the other portion through a direct contact, or another portion may be disposed therebetween.

A display device according to the present invention is characterized by using two substrates, wherein one substrate includes a display element and the other substrate includes lines. The lines serve to transfer current, driving signals and the like to the display device.

FIGS. 2A to 2D illustrate a display device according to a first embodiment of the present invention and first and second substrates thereof. The display device according to the first embodiment of the present invention is explained below with reference to FIGS. 2A to 2D.

Figure 2A:
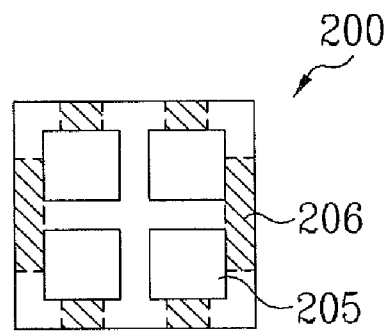
FIGS. 2A to 2D illustrate a display device according to a first embodiment of the present invention and first and second substrates thereof.

First, FIG. 2A shows a display element 200 including pixels 205. In this case, the substrate may be formed of different materials according to types of the pixels 205 formed on the substrate. Further, the pixels 205 include OLED, PDP and LCD pixels and the like to display text, image information and the like. That is, the display element 200 includes a plurality of pixels. As the respective pixels are operated on and off, the display element 200 can display text, a pattern or a moving picture and the like. Further, as shown in the drawings, it is preferable that the pixels 205 include a plurality of pixels. Further, since text or image information is displayed according to whether the respective pixels are operated on and off, it is preferable to independently apply driving signals to the respective pixels. Thus, as shown in the drawings, lines 206 are formed for the respective pixels, and two lines 206 are formed for each pixel in this embodiment.

If an OLED is used as a display device, an anode, a hole injecting layer, a hole transporting layer, a light emitting layer, an electron transporting layer and a cathode are sequentially formed on the substrate. In this case, electrode lines are respectively connected to the anode and the cathode of the OLED, independently of lines formed on the second substrate.

Figure 2B:
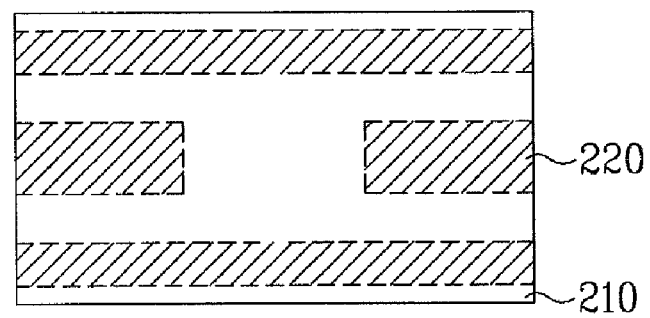

Further, FIG. 2B shows a transparent plate 210 with a transparent conductive material 220 formed thereon. In this case, although lines formed on the transparent plate 210 are not necessarily transparent, it is preferable that the electrode is formed of a transparent material in case of using the transparent conductive material 220 or in order to improve the aesthetic effect of the display device. Further, the transparent plate 210 may be formed of glass, plastic or the like. For example, the transparent conductive material 220 may be formed of ITO, IZO, $SiO_2$, ZnO or the like. Further, the transparent conductive material 220 is divided into four portions in FIG. 2B to apply driving signals to the respective pixels as will be described later. Further, although the transparent conductive material 220 is formed of a transparent material, the transparent conductive material 220 is represented by oblique lines in FIG. 2B to distinguish the transparent conductive material 220 from the transparent plate 210.

Figure 2C:
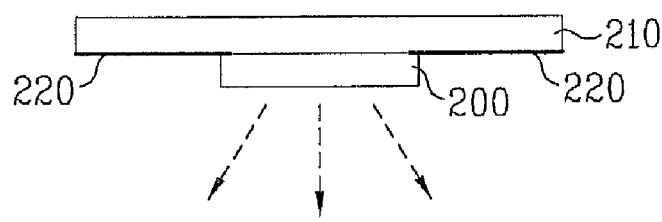

FIG. 2C illustrates a display device in which the display element 200 is coupled to the transparent plate 210. Specifically, FIG. 2C shows a side view of the display element 200 coupled to a central portion of the transparent plate 210. In this case, the structure of pixels and lines formed on the display element 200 is omitted, and the transparent conductive material 220 formed on the transparent plate 210 is partially contacted to the display element 200. Such contact points are connecting portions to apply driving signals to a light emitting device. Further, as shown in FIG. 2C, a central portion of the transparent plate 210 covers the display element 200. Accordingly, if the light emitting device is an OLED in this embodiment, the central portion of the transparent plate 210 may serve as a sealing layer. Further, although a bottom emission type OLED is shown in FIG. 2C, it may be a top emission type OLED.

Figure 2D:
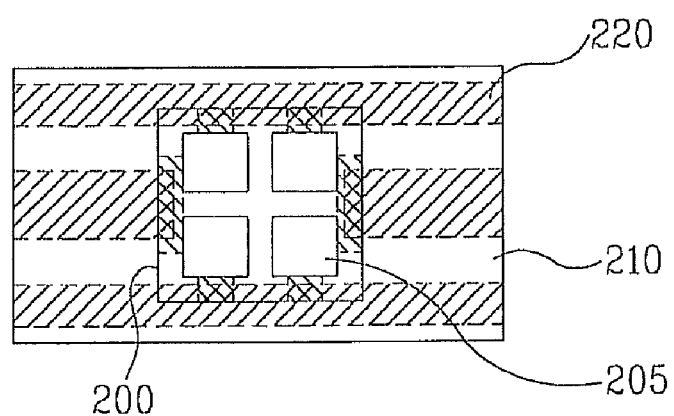

FIG. 2D illustrates a plan view of the display device shown in FIG. 2C. As shown in FIG. 2D, the transparent conductive material 220 is formed on the transparent plate 210. Further, the display element 200 is formed on the central portion of the transparent plate 210. In this case, a plurality of pixels is formed on the display element 200 and the respective pixels are connected to the transparent conductive material 220 through the lines. Further, although not shown in the drawings, the transparent plate 210 is disposed on a body of an application product and the transparent conductive material is electrically connected to the application product such that driving signals, power and the like are supplied to the transparent conductive material.

In this case, the application product means a product using a display device including the above-described display element 200 and transparent plate 210. That is, although the above-described display device is used as an independent device, the display device may be used as a part of various types of application products, which will be described later.

An effect of the display device according to the first embodiment of the present invention is explained below.

In this embodiment, the pixels of the OLED are formed on the substrate, and the transparent plate is in contact with the substrate to seal the pixels, thereby serving as an encapsulating plate. Further, the transparent plate has a size larger than the size of the pixels of the OLED. When it is applied to an electronic product or the like, the transparent plate can be formed to have a size and a shape equal or similar to those of one surface of the electronic product. Accordingly, as a result, the transparent plate made of glass, plastic or the like which is coated on one surface of the electronic product serves as an encapsulating plate of the OLED. Thus, when a light emitting device such as an OLED is applied to an electronic product, it is possible to minimize the manufacturing cost of a panel and the like by minimizing the waste of the substrate. Further, since it is easy to manufacture general glass and plastic in a desired shape, it is possible to manufacture substrates having various shapes and sizes when it is applied to a product, thereby enabling various design applications.

Figure 3A:
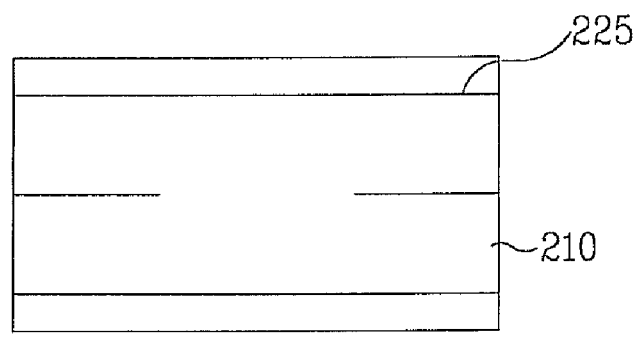
FIGS. 3A and 3B illustrate a display device according to a second embodiment of the present invention and first and second substrates thereof.
Figure 3B:
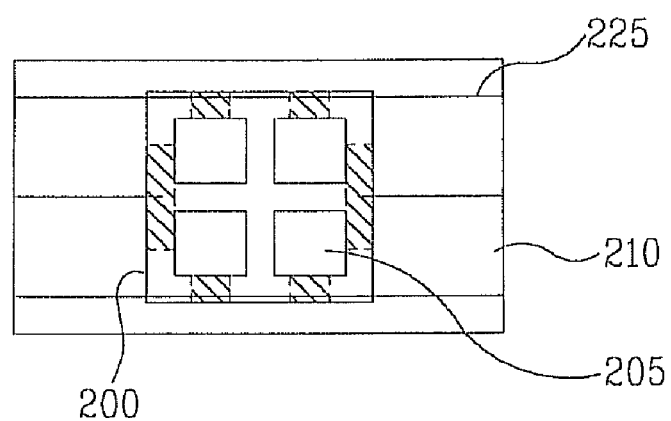

FIGS. 3A and 3B illustrate a display device according to a second embodiment of the present invention and first and second substrates thereof. The display device according to the second embodiment of the present invention is explained below with reference to FIGS. 3A and 3B.

In FIG. 3A, a metal 225 is formed on the transparent plate 210 and the metal 225 is formed of thin metal. That is, this embodiment features that driving signals are applied to a light emitting device through the thin metal 225 instead of the transparent conductive material of the above embodiment. In this case, the metal 225 is formed of a conductive material. The metal 225 should have a thickness which is difficult to be cut, but if the thickness of the metal 225 is excessively large, it may ruin the beauty of the light emitting device. If the metal 225 is manufactured to have a diameter of 1 mm or less, it is possible to ensure durability without ruining the beauty. Further, FIG. 3B illustrates a plan view of the display device in which a first substrate 310 is coupled to the second substrate 210 shown in FIG. 3A. In this case, the display element 200 is equal to the display element 200 shown in the first embodiment. Accordingly, pixels and lines of an OLED or the like are formed on the display element 200. The lines are connected to the metal 225 formed on the transparent plate 210 to receive driving signals of the light emitting device.

In the display device according to the second embodiment of the present invention, when a light emitting device of an OLED is applied to a substrate, it is possible to minimize the manufacturing cost of a panel and the like by minimizing the waste of the substrate. Further, it is possible to transfer driving signals through thin metal. Furthermore, as described above, the pixels of the OLED are formed on the substrate and the transparent plate is in contact with the substrate to seal the pixels, thereby serving as an encapsulating plate.

Figure 4A:
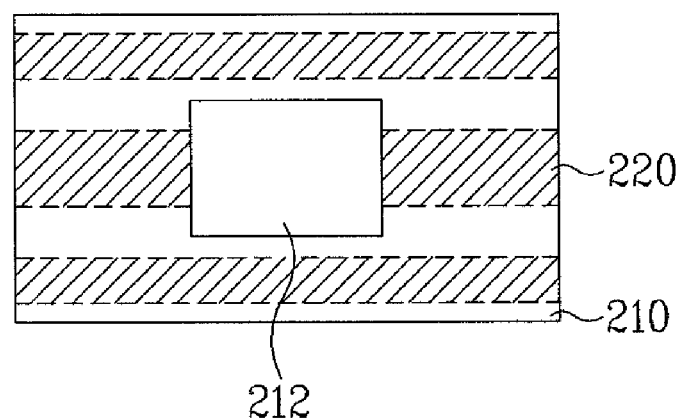
FIGS. 4A and 4B illustrate a display device according to a third embodiment of the present invention and first and second substrates thereof.
Figure 4B:
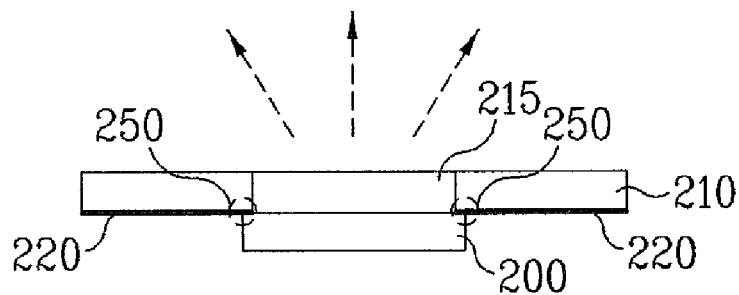

FIGS. 4A and 4B illustrate a display device according to a third embodiment of the present invention and first and second substrates thereof. The display device according to the third embodiment of the present invention is explained below with reference to FIGS. 4A and 4B.

This embodiment features that a groove is formed on the central portion of the transparent plate. Further, an encapsulating plate of the display device is formed to have a smaller size than that of the display device. In this case, the encapsulating plate is inserted into the groove.

First, FIG. 4A shows the transparent plate 210 with the transparent conductive material 220 formed thereon. Further, a groove 212 is formed in the transparent plate 210. Although the groove 212 formed in a rectangular shape is shown in FIG. 4A, the groove 212 may be formed in different shapes such as a triangular shape or a circular shape. The shape of the groove 212 may be selected according to the shape of the display device. Further, as described above, metal may be formed instead of the transparent conductive material 220.

Next, FIG. 4B illustrates a display device in which the display element 200 is coupled to the transparent plate 210. In this case, although not shown in the drawings, the pixels and lines are formed on the display element 200. Further, an encapsulating plate 215 is formed on the display element 200 to seal the display element 200. Further, the encapsulating plate 215 is inserted into the groove 212 inside of the transparent plate 210. In FIG. 4B, the transparent conductive material 220 formed on the transparent plate 210 is partially contacted to the display element 200. Contact points 250 are shown in FIG. 4B, and driving signals of the light emitting device are transferred to the display element 200 through the contact points 250. Further, the display device shown in FIG. 4B is a top emission type device if a light emitting device is an OLED, and may be a bottom emission type device.

In the display device according to the third embodiment of the present invention, the groove is formed in the substrate. Accordingly, it is possible to minimize the manufacturing cost of a panel and the like by minimizing the waste of the substrate. Further, light emitted from the pixels is directly emitted to the outside without passing through the transparent plate. Thus, reproducibility of color purity is further enhanced.

The above-described display device according to the present invention can be used in various application products. In this case, the display device can display operation characteristics of the product and the like by driving signals applied from the lines connected to the application product.

Figure 5:
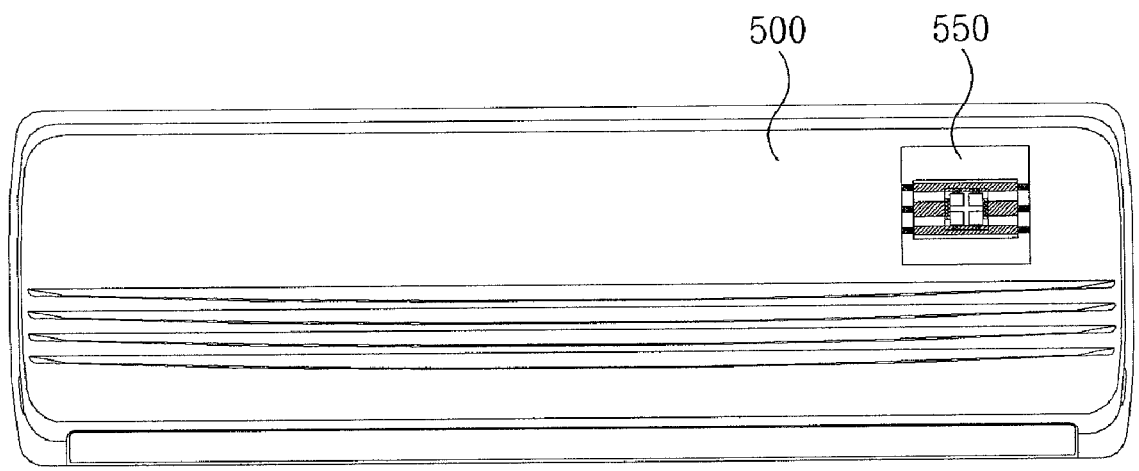
FIG. 5 illustrates an air conditioner having the display device according to the present invention.

Specifically, an example in which the display device is used in an air conditioner is explained. As shown in FIG. 5, a display device 550 disposed at an outer portion of an air conditioner 500 may display a room temperature, a setting state of the air conditioner and the like. In this case, the above-described display device makes it possible to reduce the manufacturing cost without ruining the beauty of the display. Further, when a chromatic substrate is used instead of the transparent plate, it is possible to improve the beauty of the display device. Although the transparent plate is formed at a portion of a front surface of a body of the air conditioner in FIG. 5, if the transparent plate is formed on the whole front surface of the body, it may promote the beauty. Further, the body of the air conditioner may have a circular, triangular or star shape instead of a rectangular shape, and the transparent plate may be formed in the same shape as the body of the air conditioner. In this case, it is possible to obtain an aesthetic effect and an advantage in a manufacturing process since it is easy to join the transparent plate to the air conditioner.

Figure 6:
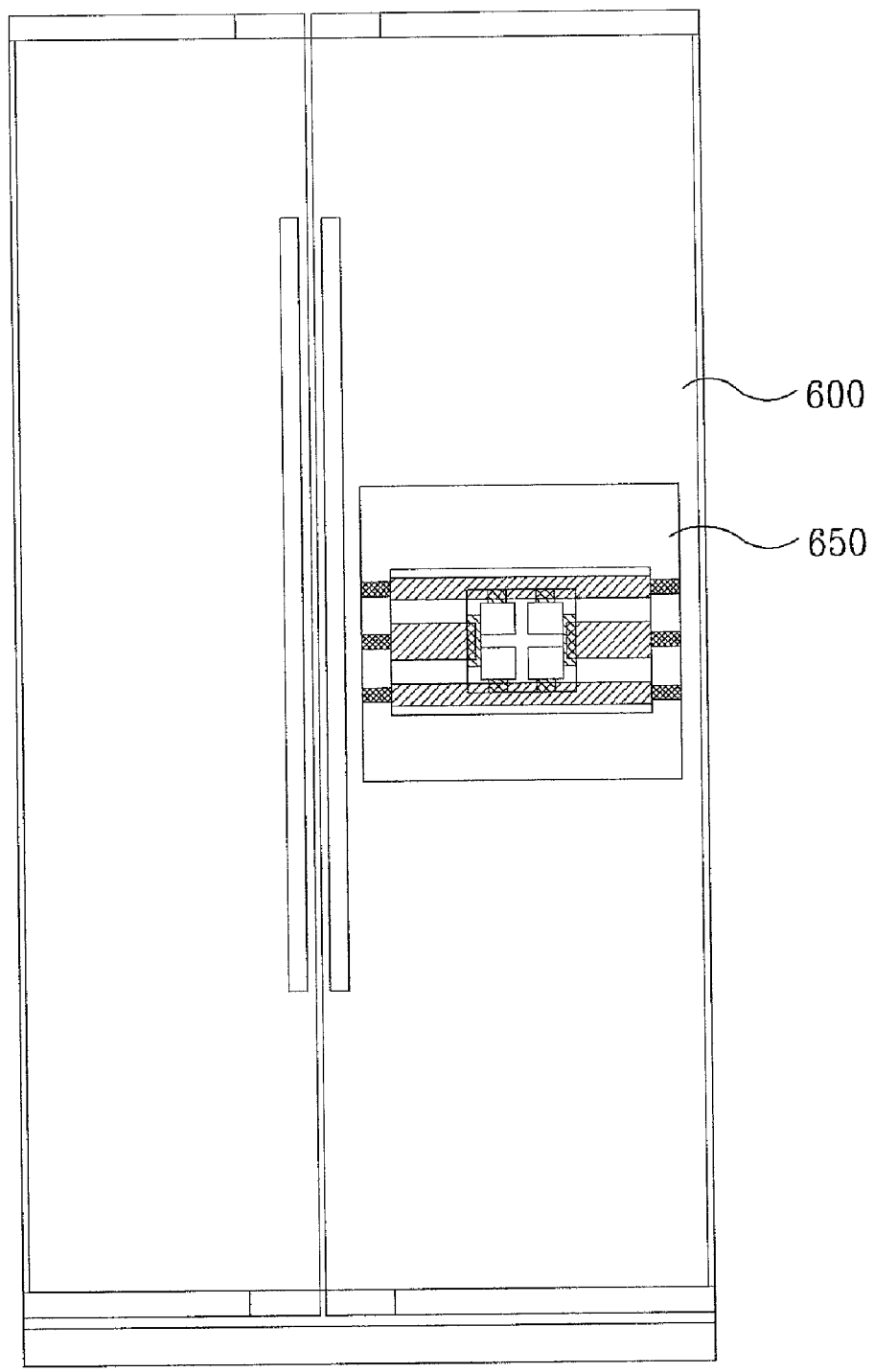
FIG. 6 illustrates a refrigerator having the display device according to the present invention.

Further, as shown in FIG. 6, a display device 650 disposed at an outer portion of a refrigerator 600 may display a cooling state, temperature setting and the like. In this case, the display device including the display element, the transparent plate and the like makes it possible to reduce the manufacturing cost without ruining the beauty of the display. Further, as described above, when a chromatic substrate is used instead of the transparent plate, it is possible to improve the beauty of the display device.

Figure 7:
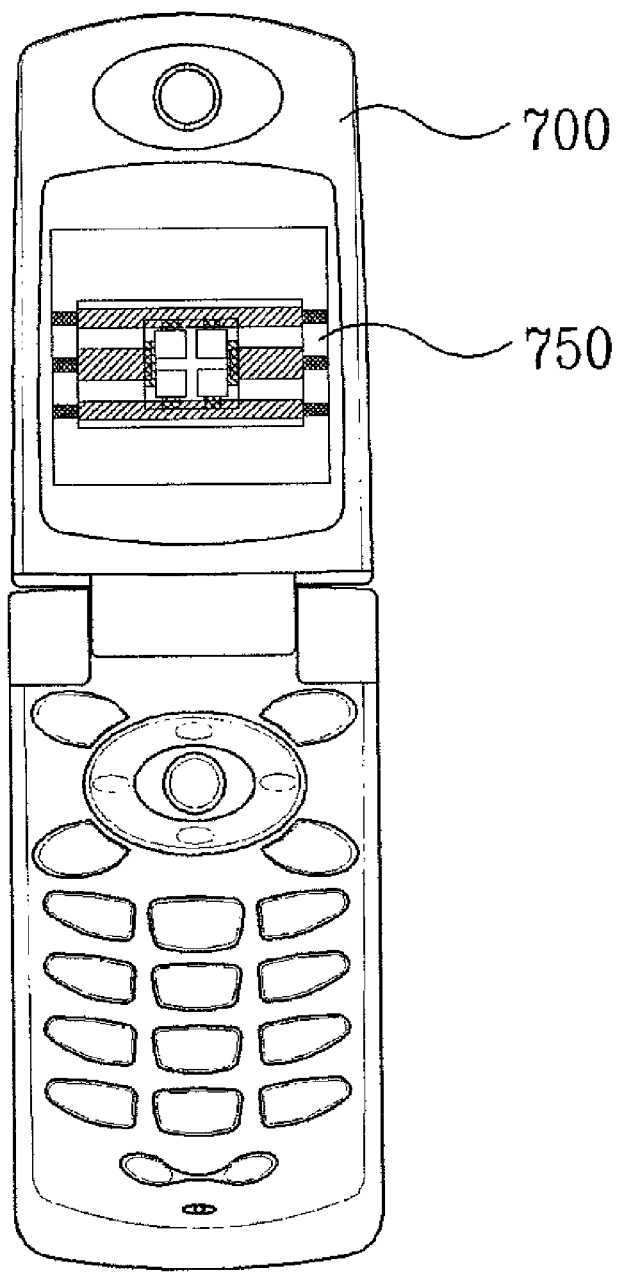
FIG. 7 illustrates a mobile phone having the display device according to the present invention.

Further, as shown in FIG. 7, a display device 750 disposed at an outer portion of a mobile phone 700 may display dialing and dialed numbers, text information and the like. Further, the display device 750 has the same configuration as the above-described air conditioner, refrigerator or the like. Further, although four OLED pixels are shown in FIG. 7, a number of the pixels sufficient to display a text message, a moving picture and the like are provided on the entire screen. Further, although respective components, a transparent conductive material and the like are shown to be distinguishable to promote the understanding, they cannot be easily distinguished with the naked eye.

In the above-described display device and a temperature control unit including the same according to the present invention, when a light emitting device such as an OLED is formed on a substrate, it is possible to minimize the manufacturing cost of a panel and the like by minimizing the waste of the substrate. Further, since it is easy to manufacture general glass and plastic in a desired shape, it is possible to manufacture substrates having various shapes and sizes when it is applied to a product, thereby enabling various design applications.

That is, the display device according to the present invention can be used in various electronic products, for example, a washing machine, a power unit such as a vacuum cleaner in addition to the above-described temperature control units such as a refrigerator and an air conditioner. Further, even in application products except electronic products, when it is necessary to display information regarding a product and the like, the display device may be attached to the product and used.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
a transparent plate having a first area and a peripheral area adjacent the first area;
a first conductive line coupled to the peripheral area of the transparent plate;
a substrate having an emission area and a non-emission area, the substrate coupled to the first area of the transparent plate;
at least one pixel coupled to the emission area of the substrate; and
a second conductive line coupled to the non-emission area of the substrate,
wherein the second conductive line is electrically coupled between the at least one pixel and the first conductive line,
wherein the emission area of the substrate which includes the at least one pixel overlaps the first area of the transparent plate,
wherein the non-emission area of the substrate to which the second conductive line is coupled at least partially overlaps the peripheral area of the transparent plate to which the first conductive line is coupled,
wherein the first conductive line does not overlap the at least one pixel coupled to the substrate, and wherein the transparent plate does not include a pixel opposing the emission area of the substrate.

2. The display device according to claim 1, wherein the transparent plate seals the at least one pixel.

3. The display device according to claim 1, wherein the at least one pixel includes an OLED (Organic Light Emitting Diode).

4. The display device according to claim 3, wherein the OLED is formed to include an anode, a light emitting layer and a cathode, and wherein the anode and the cathode are independently coupled to the second conductive line.

5. The display device according to claim 1, wherein the second conductive line is formed of a transparent conductive material.

6. The display device according to claim 5, wherein the transparent conductive material is selected from a group consisting of ITO, IZO, $SiO_2$ and ZnO.

7. The display device according to claim 4, wherein the second conductive line is formed of metal.

8. The display device according to claim 1, wherein the transparent plate is formed as a chromatic plate to change a color of light emitted from the at least one pixel.

9. The display device according to claim 1, wherein the at least one pixel emits light included in a displayed text or image.

10. The display device according to claim 1, further comprising:
a groove in the first area of the transparent plate; and
an encapsulating plate over the emission area of the substrate to cover the at least one pixel, wherein the encapsulating plate is inserted in the groove.

11. The display device according to claim 10, wherein the encapsulating plate has a smaller area than that of the substrate.

12. A terminal having a body coupled to a display device as recited in claim 1.

13. The terminal according to claim 12, wherein the transparent plate has substantially a same shape as one surface of the body of the terminal.

14. A temperature control unit having a body coupled to a display device as recited in claim 1.

15. A power unit having a body coupled to a display device as recited in claim 1.

16. The display device according to claim 1, wherein the first conductive line has a length greater than a length of the second conductive line.

17. The display device according to claim 1, wherein the first conductive line has a width less than a width of the second conductive line.

* * * * *